(12) United States Patent
Moore

(10) Patent No.: US 6,777,290 B2
(45) Date of Patent: Aug. 17, 2004

(54) GLOBAL COLUMN SELECT STRUCTURE FOR ACCESSING A MEMORY

(75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 10/212,518

(22) Filed: Aug. 5, 2002

(65) Prior Publication Data

US 2004/0023457 A1 Feb. 5, 2004

(51) Int. Cl.⁷ .......................................... H01L 21/336
(52) U.S. Cl. ...................... 438/257; 438/405; 438/453
(58) Field of Search .............................. 438/257, 288, 438/404, 405, 453

(56) References Cited

U.S. PATENT DOCUMENTS 5,247,480 A * 9/1993 Itoh et al. .............. 365/185.17

* cited by examiner

Primary Examiner—Phuc T. Dang
(74) Attorney, Agent, or Firm—Williams, Morgan & Amerson, P.C.

(57) ABSTRACT

An integrated circuit chip comprises a periphery portion and a memory portion. The memory portion includes a data storage layer and a logic layer formed underneath the data storage layer and is separated therefrom by an intermediate layer. A first conductive layer is formed within the intermediate layer to communicatively couple the periphery and memory portions of the integrated circuit chip, and a second conductive layer is formed within the intermediate layer to communicatively couple the periphery and memory portions of the integrated circuit chip. The first and second conductive layers provide addressing and data retrieval between the memory portion and the periphery portion.

42 Claims, 8 Drawing Sheets

GLOBAL COLUMN SELECT STRUCTURE FOR ACCESSING A MEMORY

BACKGROUND OF THE INVENTION

1. Field of the Invention

The present invention relates generally to integrated circuit memory devices, and, more particularly, to a global column select structure for accessing a memory, such as a dynamic random access memory (DRAM), for example.

2. Description of the Related Art

Modem integrated circuit memory devices generally include high density memory arrays on an integrated circuit chip. The array contains many memory cells, each of which stores a bit of data. In many memory devices, such as dynamic random access memories (DRAMs), for example, each of the memory cells stores an electrical charge, where the value of the electrical charge is indicative of the logical bit value stored in the cell. The absence of an electrical charge in the memory cell may indicate a logical "zero;" whereas, the presence of an electrical charge in the memory cell may indicate a logical "one."

The numerous memory cells in an integrated circuit memory device are typically arranged in an array having a number of intersecting rows and columns. One memory cell is normally associated with each intersection of a row and a column. Word lines, which correspond to rows in the array, are used to access the memory cells connected to that word line. Bit lines, which correspond to columns in the array, are used to interconnect memory cells to sense amplifiers where the presence or absence of an electrical charge in the memory cell can be detected. Row decoders and column decoders activate a selected word line and a selected bit line to access a particular memory cell as designated by an address input to the memory device.

Typically, the various columns of the memory array are grouped into sub arrays. Data within these columns is retrieved by either a column select (CS) bit line or a global column select (GCS) bit line that is routed from a periphery of the integrated circuit chip to the memory array. Generally, the CS bit line is used to address a particular sense amplifier to select from a column of data within a "local" sub array. The GCS bit line, on the other hand, is used to "globally" select from particular columns of data from the sub arrays. Typically, the CS bit line is routed from the periphery of the integrated circuit chip to the memory array through an intermediate layer that separates an upper data storage (e.g., capacitive) layer and a lower logic layer that forms the memory array. The GCS bit line is typically routed above the data storage layer (i.e., above the memory array) between the periphery of the integrated circuit chip and the memory array.

It is generally desired in device designs incorporating PCRAM operation, for example, to have the area over the data storage layer (i.e., the memory array) free of any patterning to allow for cell definition. Because the GCS bit line is typically routed over the memory array, the area over the array is not substantially free, which may make PCRAM operation difficult (i.e., it is desirable to form PCRAM memory cell materials as a continuous sheet). Additionally, because the height of the data storage layer is typically on an order of three times the height of the logic layer, routing the GCS bit line over the data storage layer yields a very deep via that must be etched in the integrated circuit chip to route the GCS line down to the substrate of the chip. For example, the via could be as much as 3 microns deep, which is highly undesirable when 0.1–0.15 micron design constraints are typically contemplated.

The present invention is directed to overcoming, or at least reducing the effects of, one or more of the problems set forth above.

SUMMARY OF THE INVENTION

In one aspect of the present invention, a method is provided. The method includes forming a first conductive layer between a data storage layer and a control layer of a memory. A second conductive layer is formed beneath the first conductive layer. The first and second conductive layers provide addressing and data retrieval between the memory and a periphery of an integrated circuit chip.

In another aspect of the present invention, a method for forming conductive layers in an integrated circuit chip is provided. The integrated circuit chip comprises a periphery portion and a memory portion, the memory portion including a capacitive layer and a logic layer formed underneath the capacitive layer and separated therefrom by an intermediate layer. The method comprises forming a first conductive layer within the intermediate layer to communicatively couple the periphery and memory portions of the integrated circuit chip, and forming a second conductive layer within the intermediate layer to communicatively couple the periphery and memory portions of the integrated circuit chip. The first and second conductive layers provide addressing and data retrieval between the memory portion and the periphery portion.

In another aspect of the present invention, an integrated circuit chip is provided. The chip comprises a periphery portion for generating addressing information and a memory portion for storing data in a plurality of memory cells forming an array. The memory portion comprises a capacitive layer, a logic layer residing below the capacitive layer, and an intermediate layer formed between the capacitive layer and the logic layer. The intermediate layer includes first and second conductive layers to communicatively couple the periphery and memory portions. The first and second conductive layers provide the addressing information generated from the periphery portion to the array for retrieving data therefrom.

In another aspect of the present invention, a system is provided. The system comprises a processor and a memory for storing data in a plurality of memory cells forming an array. The memory comprises a data storage layer, a control layer residing beneath the data storage layer, and first and second conductive layers formed between the data storage layer and the control layer to communicatively couple a chip periphery and the memory. The first and second conductive layers providing addressing information generated by the chip periphery to the array for retrieving data therefrom.

In another aspect of the present invention, a computer system is provided. The computer system comprises a processor and a memory. The memory comprises a capacitive layer, a logic layer residing beneath the capacitive layer, and column select (CS) and global column select (GCS) bit lines formed between the capacitive and logic layers to communicatively couple the memory to a chip periphery. The CS and GCS bit lines provide addressing information generated by the chip periphery to an array of the memory for retrieving data therefrom.

In another aspect of the present invention, a memory device is provided for storing data in a plurality of memory cells forming an array. The memory device comprises a data storage layer, a control layer residing beneath the data storage layer, and first and second bit lines formed between the data storage and control layers to communicatively couple the memory device to a periphery of a chip, the first and second bit lines providing addressing information generated from the periphery of the chip to the array for retrieving data therefrom.

In another aspect of the present invention, a system board is provided. The system board comprises a periphery component and a memory component. The memory component includes a capacitive layer, a logic layer residing beneath the capacitive layer, and an intermediate layer formed between the capacitive layer and the logic layer. The intermediate layer includes first and second conductive layers to communicatively couple the periphery and memory components. The first and second conductive layers provide addressing information generated by the periphery component to an array of the memory component for retrieving data therefrom.

BRIEF DESCRIPTION OF THE DRAWINGS

The invention may be understood by reference to the following description, taken in conjunction with the accompanying drawings, in which like reference numerals identify like elements, and in which.

Figure 1A:
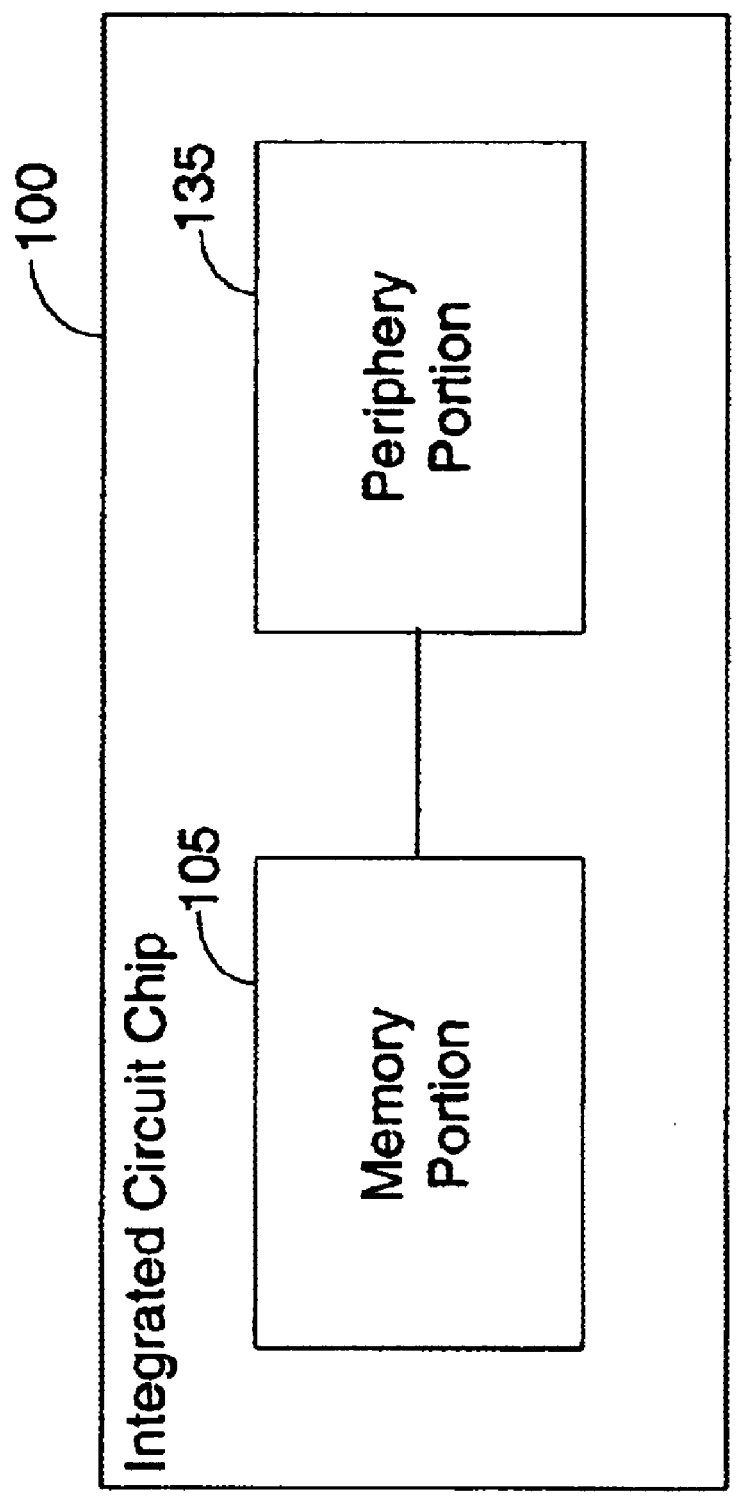
FIG. 1a shows a simplified block diagram of an integrated circuit chip, which includes a memory portion and a periphery portion, in accordance with an illustrated embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1a, a simplified block diagram of an integrated circuit chip 100, which includes a memory portion 105 and a periphery portion 135, is shown in accordance with one illustrative embodiment of the present invention. It will be appreciated that the integrated circuit chip 100 may be a stand alone memory device or a memory device incorporated into a larger group of integrated circuit devices. According to the illustrated embodiment, the memory portion 105 comprises a high-density memory, such as a dynamic random access memory (DRAM), for example. It will be appreciated, however, that the present invention need not necessarily be limited to a DRAM, or even to a high-density memory, but may employ a variety of other types of memory, such as a flash memory, static random access memory (SRAM), double data rate random access memory (DDRRAM), electrically-erasable programmable read only memory (EEPROM), erasable programmable read only memory (EPROM), programmable read only memory (PROM), and read only memory (ROM) without departing from the spirit and scope of the present invention.

Figure 1B:
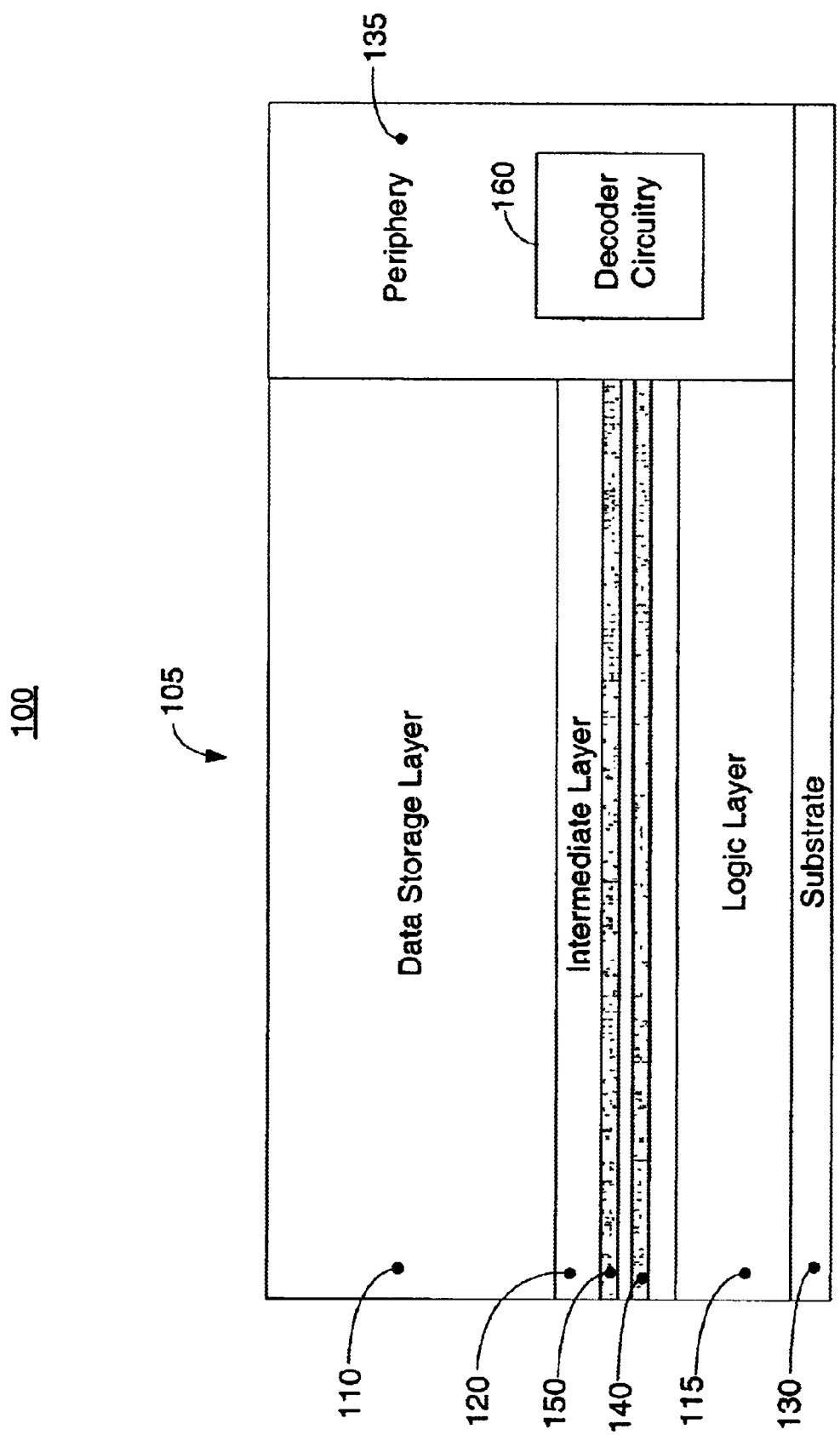
FIG. 1b illustrates a more detailed, cross-sectional view of the integrated circuit chip of FIG. 1a according to an illustrated embodiment of the present invention.

Turning now to FIG. 1b, the memory portion 105 comprises a data storage layer 110 (e.g., a capacitive layer) that includes a plurality of storage devices (e.g., capacitors) and a logic (or control) layer 115 that includes a plurality of access or control devices (e.g., transistors). The logic layer 115 may be disposed below the data storage layer 110 and may be formed on a substrate 130 of the integrated circuit chip 100. The data storage layer 110 is generally disposed above the logic layer 115 to obtain a higher capacitance area. The data storage layer 110 and the logic layer 115 are separated by an intermediate layer 120 formed therebetween.

Data that is stored within the memory portion 105 is accessible by providing addressing information from a periphery portion 135 to the memory portion 105 of the integrated circuit chip 100 through one or more control lines, such as a column select (CS) bit line 140 and/or a global column select (GCS) bit line 150. The periphery portion 135 of the integrated circuit chip 100 includes decoder circuitry 160, which generates addressing information for retrieving data from the memory portion 105. The manner in which the addressing information is decoded by the decoder circuitry 160 in the periphery portion 135 is well known to those skilled in the art. Accordingly, the specifics for decoding the addressing information is not provided herein so as to avoid unnecessarily obscuring the present invention.

Figure 2:
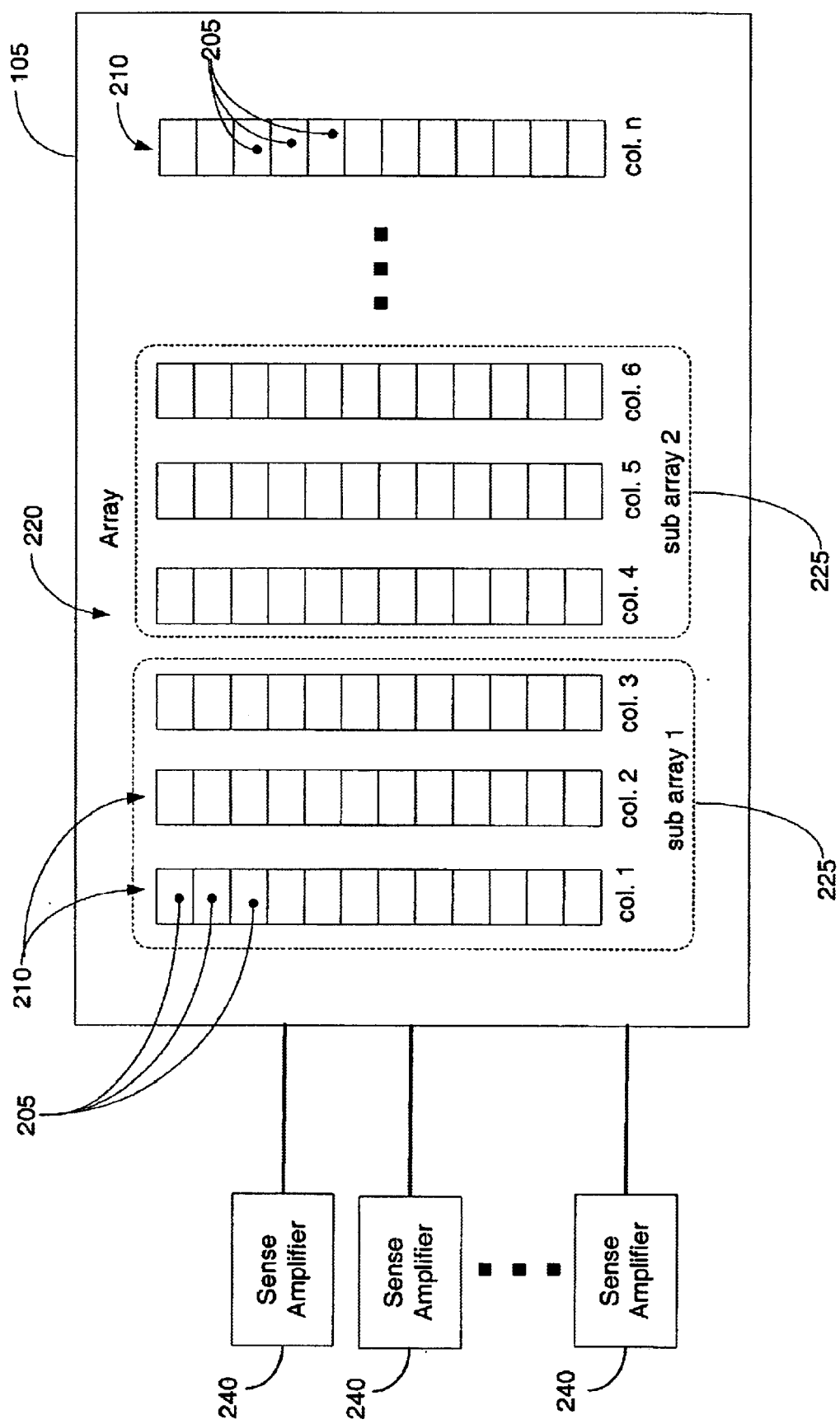
FIG. 2 provides a more detailed representation of the memory portion of FIG. 1a in accordance with the illustrated embodiment of the present invention.

Referring now to FIG. 2, a more detailed perspective of the memory portion 105 is shown according to one embodiment. The memory portion 105 comprises a multitude of memory cells 205 that may be arranged in a plurality of columns 210 (e.g., columns 1 to n) and rows that form a memory array 220 for storing data. The memory array 220 may further be divided into a plurality of sub arrays 225, which each include a set number of columns 210 of the memory cells 205. Although FIG. 2 illustrates each sub array 225 comprising three columns 210, it will be appreciated that the number of columns 210 that form each sub array 225 may vary, and, thus, need not necessarily be limited to the particular example as illustrated. The data residing within certain columns 210 of the memory array 220 are retrieved by sense amplifiers 240, which may reside within the logic layer 115 of the memory portion 105 of the integrated circuit chip 100.

The sense amplifiers 240 are capable of detecting the presence or absence of an electrical charge in the memory cells 205 of the array 220. The addressing operation to select a particular sense amplifier 240 for retrieving specific bits of data from the memory cells 205 of the array 220 may be accomplished by utilizing the CS bit line 140 and/or the GCS bit line 150 (shown in FIG. 1b). The CS bit line 140 and/or the GCS bit line 150 may both run from the periphery portion 135 of the integrated circuit chip 100 to the array 220 of the memory portion 105.

The CS bit line 140 and the GCS bit line 150 route the addressing information that is generated by the decoder circuitry 160 within the periphery portion 135 of the integrated circuit chip 100 to the memory array 220. The addressing information uniquely identifies a particular sense amplifier 240 to retrieve data from the memory cells 205 within the array 220. Generally, the CS bit line 140 is utilized to address a particular sense amplifier 240 to select from a column of data within a "local" sub array 225. According to one embodiment, the CS bit line 140 operates in accordance with a 2× pitch retrieval scheme (i.e., it can retrieve one bit of data per two rows of cells). It will be appreciated, however, that other retrieval schemes involving the CS bit line 140, such as 4× or 8× pitch may be implemented by those of ordinary skill in the art having the benefit of the present disclosure. The GCS bit line 150, on the other hand, is used to "globally" select from particular columns 210 of data from various sub arrays 225 within the array 220. According to one embodiment, the GCS bit line 150 operates in accordance with an 8× pitch retrieval scheme (i.e., it can retrieve one bit of data per eight rows of cells). It will be appreciated that various other retrieval schemes involving the GCS bit line 150 may also be implemented without departing from the spirit and scope of the present invention.

The CS bit line 140 may be routed between the periphery portion 135 of the integrated circuit chip 100 and the memory array 220 within the intermediate layer 120 that is disposed between the data storage layer 110 and the logic layer 115. According to the illustrated embodiment, the GCS bit line 150 is also routed within the intermediate layer 120, and may be disposed above the CS bit line 140. It will be appreciated that the positioning of the CS bit line 140 and the GCS bit line 150 may also be reversed within the intermediate layer 120 without departing from the spirit and scope of the present invention. That is, the CS bit line 140 may form the upper conductive layer and the GCS bit line 150 may form the lower conductive layer without departing from the spirit and scope of the present invention. By routing the GCS bit line 150 within the intermediate layer 120 (i.e., below the data storage layer 110), the area above the memory array 220 is substantially free of any patterning, which permits cell definition. Additionally, the physical dimensions of the integrated circuit chip 100 will generally not increase as a result of routing the GCS bit line 150 within the intermediate layer 120, thereby desirably providing the integrated circuit chip 100 in a more compact form.

Figure 3:
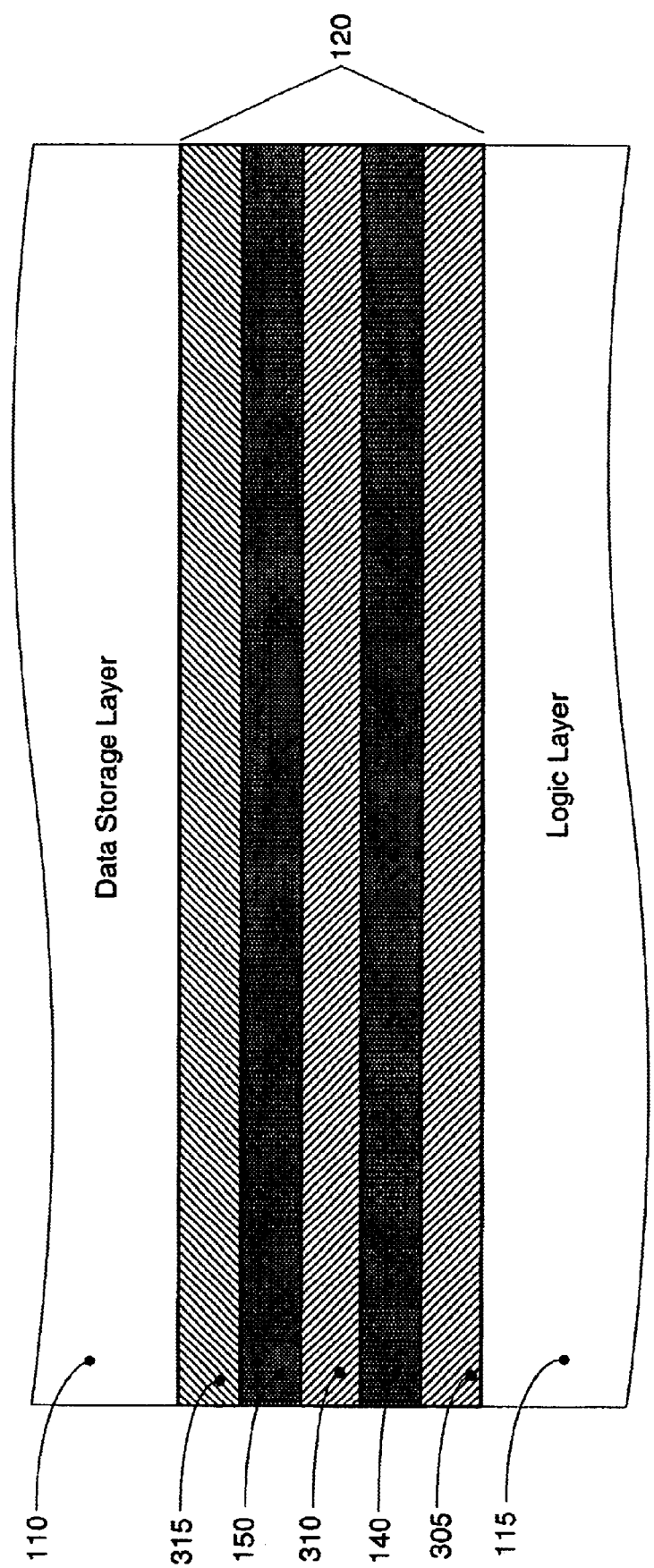
FIG. 3 provides a more detailed representation of an intermediate layer that is disposed between a data storage layer and a logic layer of the integrated circuit chip of FIG. 1b according to one embodiment of the present invention.

Turning now to FIG. 3, a more detailed representation of the intermediate layer 120 is shown in accordance with one illustrative embodiment of the present invention. In this embodiment, the GCS bit line 150 is deposited along with the CS bit line 140 in a double bit line blanket deposition process that is performed between the data storage layer 110 and the logic layer 115 of the memory portion 105. In accordance with one embodiment, the CS bit line 140 is formed from a titanium nitride and tungsten (TiN/W) conductive layer that is deposited over a first insulation layer 305. The first insulation layer 305 is generally formed over the logic layer 115. It will be appreciated that the conductive layer forming the CS bit line 140 need not necessarily have to be limited to titanium nitride and tungsten, but may alternatively include a variety of other conductive materials, such as titanium nitride, titanium tungsten, tungsten silicide, or cobalt silicide, for example, without departing from the spirit and scope of the present invention. The first insulation layer 305 that is deposited on the logic layer 115 electrically isolates the CS bit line 140 from the logic layer 115. According to one embodiment, the first insulation layer 305 may be constructed from tetraethyl orthosilicate (TEOS) oxide; however, a variety of other insulating materials including, but not necessarily limited to, a silane-based oxide, silicon nitride, or boron nitride may be used in lieu thereof to electrically isolate the CS bit line 140 from the logic layer 115.

A second insulation layer 310 is deposited over the CS bit line 140 to electrically isolate the CS bit line 140 from the GCS bit line 150. In one embodiment, the second insulation layer 310 comprises the same material as the first insulation layer 305 (i.e., TEOS oxide). It will be appreciated, however, that the material forming the second insulation layer 310 that is deposited over the CS bit line 140 need not necessarily be limited to TEOS oxide, but may include a variety of other materials, such as a silane-based oxide, silicon nitride, or boron nitride, for example, without departing from the spirit and scope of the present invention. Additionally, the first and second insulation layers 305 and 310, which collectively encapsulate the CS bit line 140, need not necessarily be limited to the same materials, but may alternatively be constructed from different insulating materials. The second insulation layer 310 electrically isolates the CS bit line 140 from the GCS bit line 150.

In accordance with the illustrated embodiment, the GCS bit line 150 is deposited over the second insulation layer 310, thereby forming a second conductive layer within the intermediate layer 120. In one embodiment, the GCS bit line 150 is also formed from a titanium nitride and tungsten (TiN/W) conductive material; however, the GCS bit line 150 may be constructed from various other conductive materials, such as titanium nitride, titanium tungsten, tungsten silicide, or cobalt suicide, for example. Additionally, although the CS bit line 140 and the GCS bit line 150 are constructed from the same conductive material in the illustrated embodiment, it will be appreciated that the CS and GCS bit lines 140, 150 may alternatively be constructed from different conductive materials without departing from the spirit and scope of the present invention.

A third insulation layer 315 is deposited on the GCS bit line 150 to electrically isolate the GCS bit line 150 from the data storage layer 110. According to the illustrated embodiment, the third insulation layer 315 is constructed from silicon nitride ($Si_3N_4$); however, it will be appreciated that a variety of other types of insulating materials may be used, such as a silane-based oxide, silicon nitride, or boron nitride, for example, without departing from the spirit and scope of the present invention. The third insulation layer 315 electrically isolates the GCS bit line 150 from the data storage layer 110.

Figure 4:
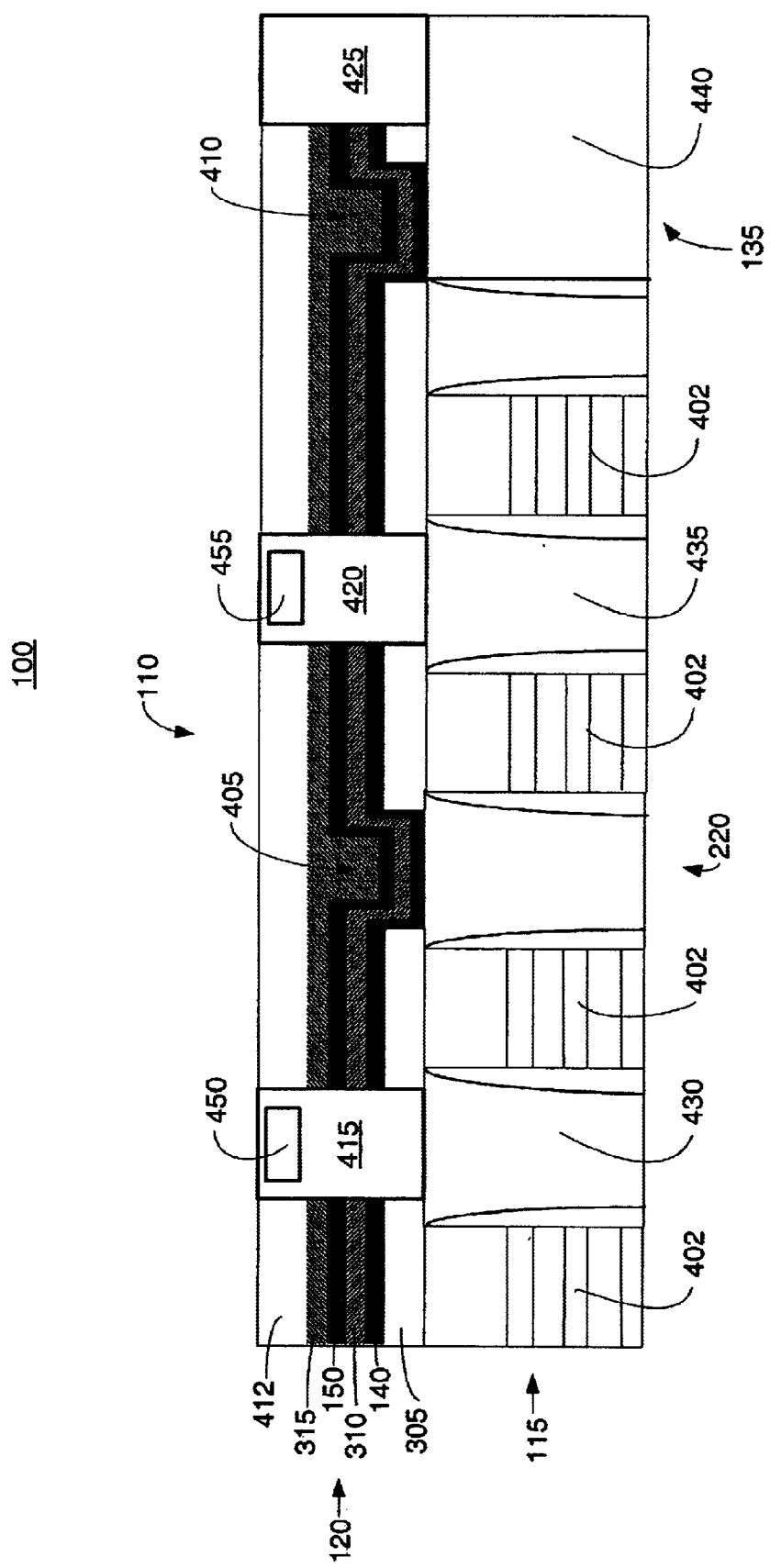
FIG. 4 illustrates an even more detailed representation of the integrated circuit chip of FIG. 1b according to an illustrated embodiment of the present invention.

Turning now to FIG. 4, a more detailed representation of the integrated circuit chip 100 is shown in accordance with one embodiment, which depicts the double bit line depositions of the CS and GCS bit lines 140 and 150. The first insulation layer 305 is deposited over the logic layer 115, which includes logic devices 402. According to one embodiment, the logic devices 402 comprise a plurality of transistors. The first insulation layer 305 electrically isolates the CS bit line 140 from the logic layer 115. The first insulation layer 305 is processed (i.e., patterned and etched) to form a first bit line contact 405 to the memory array 220 and a second bit line contact 410 to the periphery portion 135 of the integrated circuit chip 100. The CS bit line 140 is deposited over the first insulation layer 305, and the second insulation layer 310 is deposited over the CS bit line 140 to electrically isolate the CS bit line 140.

The GCS bit line 150 is then deposited over the second insulation layer 310, and the third insulation layer 315 is deposited over the GCS bit line 150 to isolate the GCS bit line 150 from the data storage layer 110. As previously discussed, the first and second insulation layers 305, 310 may be constructed from an insulating material such as TEOS oxide; the CS and GCS bit lines 140, 150 may be constructed from a conductive material such as titanium nitride and tungsten; and the third insulation layer 315 may be constructed from an insulating material such as silicon nitride. It will be appreciated, however, that these layers, which collectively form at least a portion of the intermediate layer 120, may be constructed from a variety of other materials without departing from the spirit and scope of the present invention. The intermediate layer 120 is then subsequently patterned and spacers are formed on the sidewalls of the layer 120.

In accordance with the illustrated embodiment, a BPSG (Boron-phosphorous silicate glass) insulator 412 is then deposited over the third insulation layer 315 and is planarized. A plurality of cavities 415, 420, 425 are processed (e.g., patterned and etched) within the intermediate layer 120, thereby respectively exposing contacts 430, 435, 440 within the logic layer 115, and exposing the second bit line contact 410 of the periphery portion 135. In one embodiment, polysilicon is deposited within the cavities 415, 420, 425 to fill the respective contacts 430, 435, 440. Capacitors 450, 455 are respectively disposed within the cavities 415 and 420, thereby forming the data storage layer 110.

By routing the GCS bit line 150 along with the CS bit line 140 within the intermediate layer 120, as opposed to being routed above the data storage layer 110, the area above the data storage layer 110 is substantially free of patterning, thereby permitting cell definition. Moreover, because the GCS bit line 150 gets patterned and etched at substantially the same time as the CS bit line 140 in the intermediate layer 120, there is no need for an additional masking step and etching step, which would occur if the GCS bit line 150 was alternatively routed over the data storage layer 110. Accordingly, by placing the GCS bit line 150 along with the CS bit line 140 within the intermediate layer 120, it will reduce additional processing steps, and thereby reduce the cost of manufacturing the integrated circuit chip 100. Furthermore, by placing the GCS bit line 150 in the intermediate layer 120, the physical dimensions of the integrated circuit chip 100 substantially remains the same and, accordingly, substantially reduces the effects of enlargement of the integrated circuit chip 100.

Figure 5:
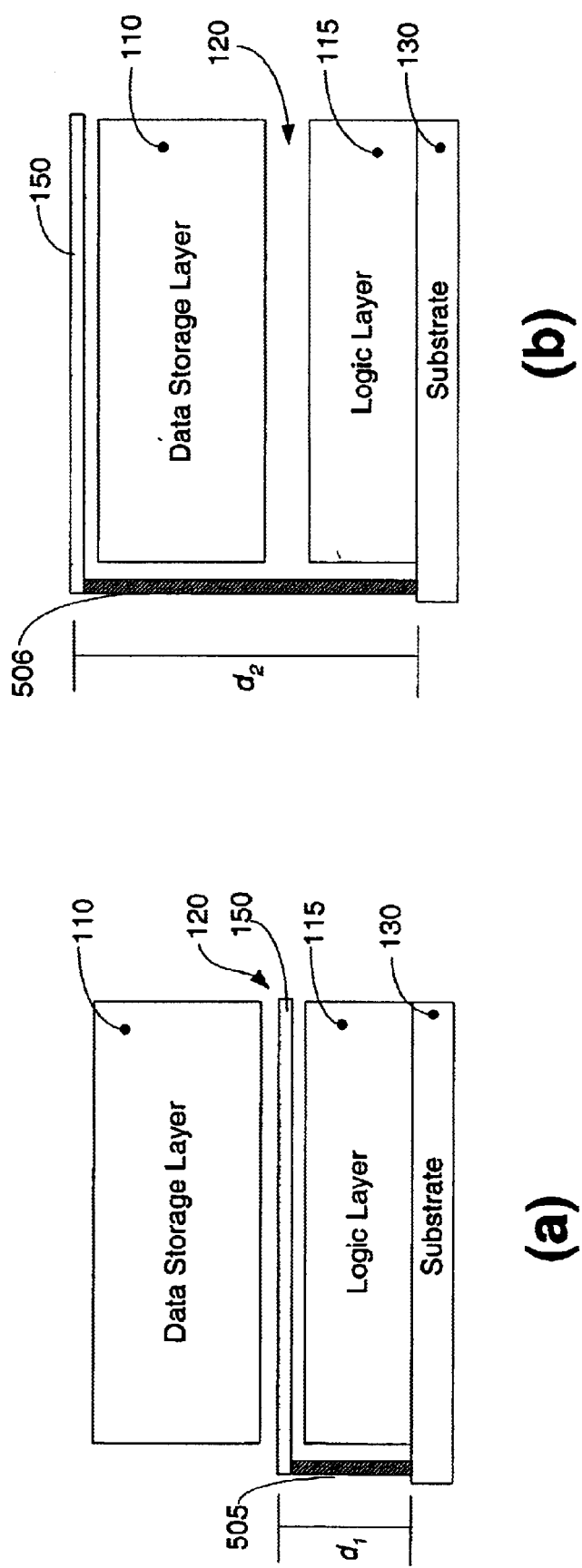
FIGS. 5a and b illustrate a via that couples a global column select (GCS) line to a substrate of the integrated circuit chip of FIG. 1b in accordance with one embodiment of the present invention.

Additionally, referring to FIGS. 5a and 5b, by routing the GCS bit line 150 through the intermediate layer 120 (as depicted in FIG. 5a), as opposed to routing the GCS line 150 above the data storage layer 110 (as depicted in FIG. 5b), a via 505 that electrically couples the GCS bit line 150 to the substrate 130 is significantly shortened. The via 505 shown in FIG. 5a has a height of $d_1$, which is significantly shorter than the height $d_2$ of a via 506 shown in FIG. 5b (which results when the GCS bit line 150 is routed over the data storage layer 110). The via 506 shown in FIG. 5b is significantly longer than the via 505 of FIG. 5a because the height of the data storage layer 110 can typically be on the order of three times the height of the logic layer 115. In certain instances, the via 506 depicted in FIG. 5b could be as much as 3 microns deep, which is undesirable when typically contemplating 0.1–0.15 micron design constraints. Accordingly, because of the height at which the GCS bit line 150 is typically routed, a relatively deep via must be etched into the integrated circuit chip 100, thereby making such etching more difficult when manufacturing the chip 100. In accordance with the present invention, however, the via 505 of FIG. 5a is significantly shorter (compared to the via 506) as a result of the GCS bit line 150 being disposed within the intermediate layer 120 (i.e., underneath the data storage layer 110).

Figure 6:
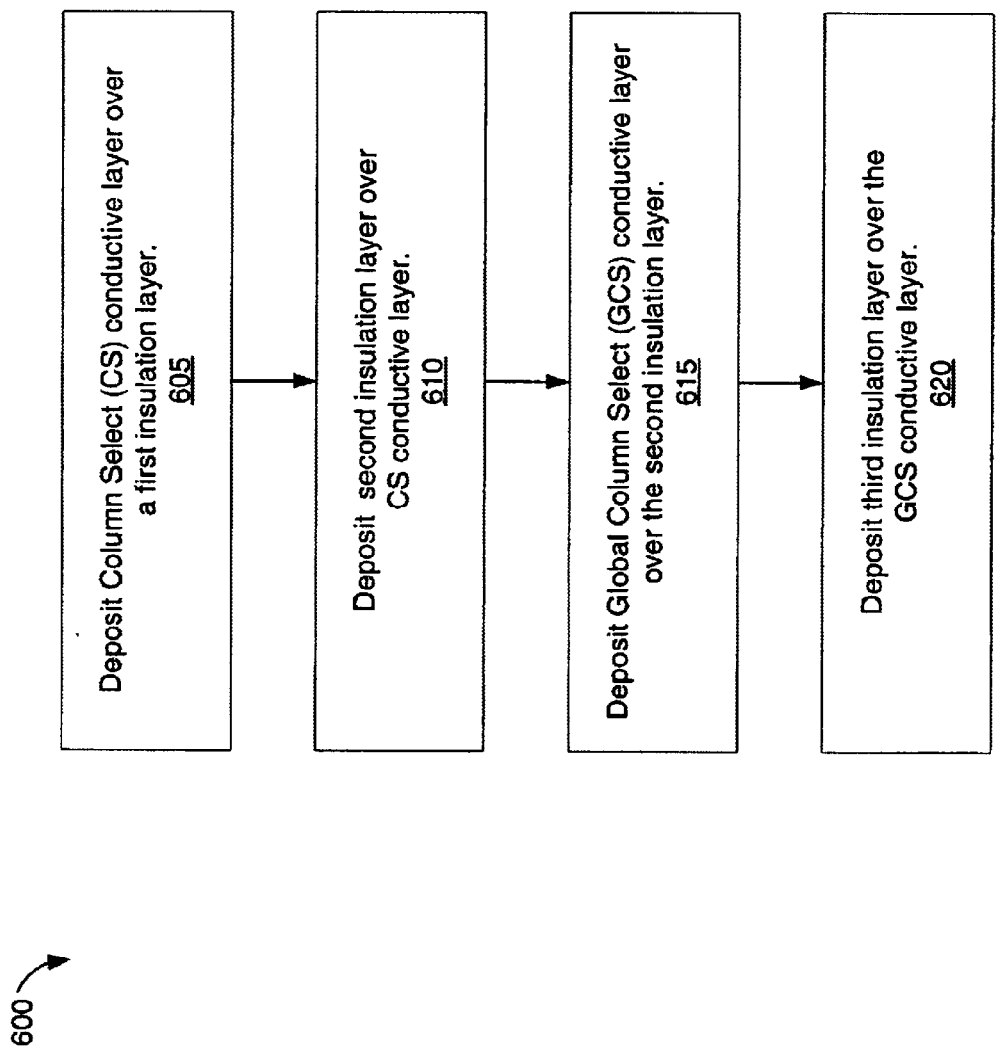
FIG. 6 shows a flowchart illustrating a process for depositing a pair of conductive layers in an intermediate layer of the integrated circuit chip of FIG. 1b according to the illustrated embodiment.

Turning now to FIG. 6, a flowchart illustrating a process 600 for performing double bit line blanket depositions on the integrated circuit chip 100, thereby forming the intermediate layer 120, is shown in accordance with one embodiment of the present invention. The CS bit line 140 (i.e., the first conductive layer) is deposited over the first insulation layer 305 (block 605). In accordance with the illustrated embodiment, the CS bit line 140 is constructed of a titanium nitride and tungsten conductive material; however, it will be appreciated that a variety of other conductive materials may be used in lieu thereof, as previously discussed. The second insulation layer 310 is then deposited over the CS bit line 140 to electrically isolate the CS bit line 140 from the GCS bit line 150 (block 610). In one embodiment, the second insulation layer 310 is constructed from TEOS oxide. It will be appreciated, however, that a variety of other insulating materials may be used to electrically isolate the CS and GCS bit lines 140, 150 without departing from the spirit and scope of the present invention.

Upon forming the second insulation layer 310, the GCS bit line 150 (i.e., the second conductive layer) is deposited on the second insulation layer 310 (block 615). In the illustrated embodiment, the GCS bit line 150 is constructed of a titanium nitride and tungsten conductive material; however, it will be appreciated that a variety of other conductive materials may be used in lieu thereof, as previously discussed. Furthermore, it will be appreciated that the GCS bit line 150 may be constructed from a different conductive material than that used for the CS bit line 140. The third insulation layer 315 is deposited over the GCS bit line 150 to electrically isolate the GCS bit line 150 from the data storage layer 110 (block 620). In accordance with the illustrated embodiment, the third insulation layer 315 includes a silicon nitride material. It will be appreciated, however, that the third insulation layer 315 may be constructed from a variety of other insulating materials, as previously discussed, without departing from the spirit and scope of the present invention.

Figure 7:
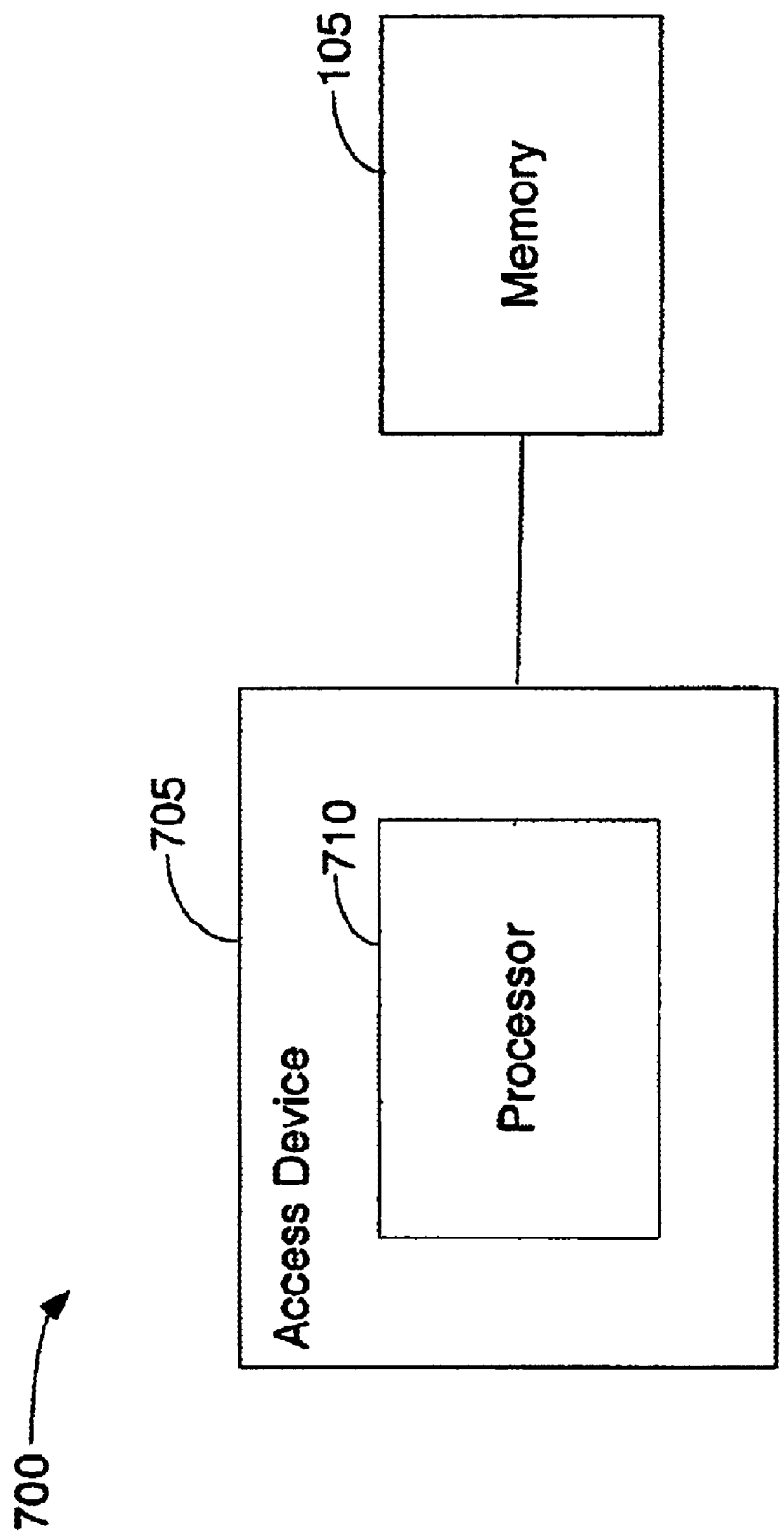
FIG. 7 illustrates a system that provides access to the memory of FIG. 2 according to one embodiment of the present invention.

Turning now to FIG. 7, a simplified block diagram of a system 700 is illustrated in accordance with one embodiment of the present invention. The system 700 includes an access device 705 having a processor 710 that is capable of accessing data stored within the memory 105. The access device 705 may be any device that uses the memory 105 to store data, read data, or both. Examples of the access device 705 may include, but are not limited to, a computer, camera, telephone, television, radio, calculator, personal digital assistant, network switch, setup-box, and the like. In one embodiment, the memory 105 may form a part of the access device 705. In an alternative embodiment, the memory 105 may be configured as a standalone unit or part of a standalone device.

The processor 710, in one embodiment, may manage the overall operation of the access device 705, including writing and reading data to and from the memory 105. In the illustrated embodiment, the processor 710 may include a microprocessor, microcontroller, digital signal processor, processor card (including one or more microprocessors or controllers), memory controller, or other control or computing devices.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit chip, comprising:
   a periphery portion for generating addressing information; and
   a memory portion for storing data in a plurality of memory cells forming an array, the memory portion comprising:
      a capacitive layer;
      a logic layer residing below the capacitive layer; and
      an intermediate layer formed between the capacitive layer and the logic layer, the intermediate layer including:
         first and second conductive layers to communicatively couple the periphery and memory portions, the first and second conductive layers providing the addressing information generated from the periphery portion to the array for retrieving data therefrom.

2. The integrated circuit chip of claim 1, wherein the intermediate layer further comprises a first insulation layer between the logic layer and the first conductive layer, the first insulation layer electrically isolating the first conductive layer from the logic layer.

3. The integrated circuit chip of claim 2, wherein the intermediate layer further comprises a second insulation layer between the first and second conductive layers, the second insulation layer electrically isolating the first and second conductive layers from each other.

4. The integrated circuit chip of claim 3, wherein the intermediate layer further comprises a third insulation layer between the second conductive layer and the capacitive layer, the third insulation layer electrically isolating the second conductive layer from the capacitive layer.

5. The integrated circuit chip of claim 1, wherein the first and second conductive layers comprise titanium nitride and tungsten.

6. The integrated circuit chip of claim 3, wherein the first and second insulation layers comprise tetraethyl orthosilicate (TEOS) oxide.

7. The integrated circuit chip of claim 4, wherein the third insulation layer comprises silicon nitride.

8. The integrated circuit chip of claim 1, wherein the first and second conductive layers comprise a column select (CS) and global column select (GCS) bit line, respectively, for sending addressing information from the periphery portion to the memory portion for accessing data from the array.

9. A system, comprising:
   a processor; and
   a memory for storing data in a plurality of memory cells forming an array, the memory comprising:
      a data storage layer; and
      a control layer residing beneath the data storage layer; and
      first and second conductive layers formed between the data storage layer and the control layer to communicatively couple a chip periphery and the memory, the first and second conductive layers providing addressing information generated by the chip periphery to the array for retrieving data therefrom.

10. The system of claim 9, further comprising a first insulation layer formed between the control layer and the first conductive layer, the first insulation layer electrically isolating the first conductive layer from the control layer.

11. The system of claim 10, further comprising a second insulation layer formed between the first and second conductive layers, the second insulation layer electrically isolating the first and second conductive layers from each other.

12. The system of claim 11, further comprising a third insulation layer formed between the second conductive layer and the data storage layer, the third insulation layer electrically isolating the second conductive layer from the data storage layer.

13. The system of claim 9, wherein the first and second conductive layers comprise titanium nitride and tungsten.

14. The system of claim 11, wherein the first and second insulation layers comprise tetraethyl orthosilicate (TEOS) oxide.

15. The system of claim 12, wherein the third insulation layer comprises silicon nitride.

16. The system of claim 9, wherein the first and second conductive layers comprise a column select and global column select line, respectively, for accessing data from the array.

17. The system of claim 9, wherein the data storage layer comprises a capacitive layer and the control layer comprises a logic layer.

18. A computer system, comprising:
   a processor and a memory, the memory comprising:
      a capacitive layer;
      a logic layer residing beneath the capacitive layer; and
      a column select (CS) and global column select (GCS) bit lines formed between the capacitive and logic layers to communicatively couple the memory to a chip periphery, the CS and GCS bit lines providing addressing information generated by the chip periphery to an array of the memory for retrieving data therefrom.

19. The computer system of claim 18, further comprising a first insulation layer between the logic layer and the CS bit line, the first insulation layer electrically isolating the CS bit line from the logic layer.

20. The computer system of claim 19, further comprising a second insulation layer between the CS and GCS bit lines, the second insulation layer electrically isolating the CS and GCS bit lines from each other.

21. The computer system of claim 20, further comprising a third insulation layer between the GCS bit line and the capacitive layer, the third insulation layer electrically isolating the GCS bit line from the capacitive layer.

22. The computer system of claim 18, wherein the CS and GCS bit lines comprise titanium nitride and tungsten.

23. The computer system of claim 20, wherein the first and second insulation layers comprise tetraethyl orthosilicate (TEOS) oxide.

24. The computer system of claim 21, wherein the third insulation layer comprises silicon nitride.

25. A memory device for storing data in a plurality of memory cells forming an array, the memory device comprising:
   a data storage layer;
   a control layer residing beneath the data storage layer; and
      first and second bit lines formed between the data storage and control layers to communicatively couple the memory device to a periphery of a chip, the first and second bit lines providing addressing information generated from the periphery of the chip to the array for retrieving data therefrom.

26. The memory device of claim 25, further comprising a first insulation layer between the control layer and the first bit line, the first insulation layer electrically isolating the first bit line from the control layer.

27. The memory device of claim 26, further comprising a second insulation layer between the first and second bit lines, the second insulation layer electrically isolating the first and second bit lines from each other.

28. The memory device of claim 27, further comprising a third insulation layer between the second bit line and the data storage layer, the third insulation layer electrically isolating the second bit line from the data storage layer.

29. The memory device of claim 25, wherein the first and second bit lines comprise titanium nitride and tungsten.

30. The memory device of claim 27, wherein the first and second insulation layers comprise tetraethyl orthosilicate (TEOS) oxide.

31. The memory device of claim 28, wherein the third insulation layer comprises silicon nitride.

32. The memory device of claim 25, wherein the first and second bit lines comprise a column select and global column select line, respectively, for accessing data from the array.

33. The memory device of claim 25, wherein the data storage layer comprises a capacitive layer and the control layer comprises a logic layer.

34. The memory device of claim 25, wherein the memory device comprises one of a dynamic random access memory (DRAM), static random access memory (SRAM), double data rate random access memory (DDRRAM), flash memory, electrical erasable programmable read only memory (EEPROM), erasable programmable read only memory (EPROM), programmable read only memory (PROM), and a read only memory (ROM).

35. A system board, comprising:
   a periphery component and a memory component, the memory component comprising:
      a capacitive layer;
      a logic layer residing beneath the capacitive layer; and
      an intermediate layer formed between the capacitive layer and the logic layer, the intermediate layer including:
         first and second conductive layers to communicatively couple the periphery and memory components, the first and second conductive layers providing addressing information generated by the periphery component to an array of the memory component for retrieving data therefrom.

36. The system board of claim 35, wherein the intermediate layer comprises a first insulation layer between the logic layer and the first conductive layer, the first insulation layer electrically isolating the first conductive layer from the logic layer.

37. The system board of claim 36, wherein the intermediate layer comprises a second insulation layer between the first and second conductive layers, the second insulation layer electrically isolating the first and second conductive layers from each other.

38. The system board of claim 39, wherein the intermediate layer comprises a third insulation layer between the second conductive layer and the capacitive layer, the third insulation layer electrically isolating the second conductive layer from the capacitive layer.

39. The system board of claim 35, wherein the first and second conductive layers comprise titanium nitride and tungsten.

40. The system board of claim 39, wherein the first and second insulation layers comprise tetraethyl orthosilicate (TEOS) oxide.

41. The system board of claim 38, wherein the third insulation layer comprises silicon nitride.

42. The system board of claim 35, wherein the first and second conductive layers comprise a column select and global column select line, respectively, for accessing data from the array.

* * * * *

UNITED STATES PATENT AND TRADEMARK OFFICE
CERTIFICATE OF CORRECTION

PATENT NO.    : 6,777,290 B2
DATED         : August 17, 2004
INVENTOR(S)   : John T. Moore It is certified that error appears in the above-identified patent and that said Letters Patent is hereby corrected as shown below:

Column 1,
Line 12, replace "Modem" with -- Modern --.

Column 6,
Line 50, replace "suicide" with -- silicide --.

Column 12,
Lines 30 and 38, replace "39" with -- 37 --.

Signed and Sealed this

Twenty-sixth Day of April, 2005

JON W. DUDAS
*Director of the United States Patent and Trademark Office*